United States Patent
Lee

(10) Patent No.: US 11,509,008 B2
(45) Date of Patent: Nov. 22, 2022

(54) HEAT EXCHANGER WITH THERMOELECTRIC MODULE AND SYSTEM FOR MANAGING HEAT OF BATTERY INCLUDING SAME

(71) Applicants: HYUNDAI MOTOR COMPANY, Seoul (KR); KIA MOTORS CORPORATION, Seoul (KR)

(72) Inventor: Gun Goo Lee, Suwon-si (KR)

(73) Assignees: HYUNDAI MOTOR COMPANY, Seoul (KR); KIA MOTORS CORPORATION, Seoul (KR)

(*) Notice: Subject to any disclaimer, the term of this patent is extended or adjusted under 35 U.S.C. 154(b) by 411 days.

(21) Appl. No.: 16/658,901

(22) Filed: Oct. 21, 2019

(65) Prior Publication Data

US 2020/0373638 A1   Nov. 26, 2020

(30) Foreign Application Priority Data

May 22, 2019   (KR) ........................ 10-2019-0060009

(51) Int. Cl.
  *H01M 10/6572* (2014.01)
  *H01L 35/30* (2006.01)
  (Continued)

(52) U.S. Cl.
  CPC ......... *H01M 10/6572* (2015.04); *F25B 21/04* (2013.01); *H01L 35/30* (2013.01);
  (Continued)

(58) Field of Classification Search
  CPC ......... H01M 10/6572; H01M 10/6554; H01M 10/6556; H01M 10/6567; H01M 2220/20;
  (Continued)

(56) References Cited

U.S. PATENT DOCUMENTS 3,552,133 A * 1/1971 Lukomsky ............ F24F 5/0042
                                                    62/3.3
4,829,771 A * 5/1989 Koslow ................ B67D 1/0869
                                                    62/3.64

(Continued)

FOREIGN PATENT DOCUMENTS

KR   10-1285411 B1   7/2013
KR   10-1373122 B1   3/2014
KR   10-1473899 B1   12/2014

*Primary Examiner* — Tho V Duong
*Assistant Examiner* — Raheena R Malik
(74) *Attorney, Agent, or Firm* — McDonnell Boehnen Hulbert & Berghoff LLP

(57) ABSTRACT

A heat exchanger with a thermoelectric module according to the present disclosure includes: a first heat exchanger including a first heat sink provided with a first base plate and first heat dissipation pins, a first thermoelectric module located over the first heat sink and performing heat absorption and heat dissipation, a plate-shaped first cooling plate located over the first thermoelectric module and having a flow channel through which coolant flows, and a first cover covering top of the first cooling plate; and a second heat exchanger having the same structure as the first heat exchanger and located under the first heat exchanger to be symmetrical with the first heat exchanger.

9 Claims, 7 Drawing Sheets

(51) Int. Cl.
*H01L 35/32* (2006.01)
*H01M 10/6554* (2014.01)
*H01M 10/6556* (2014.01)
*H01M 10/6567* (2014.01)
*F25B 21/04* (2006.01)
*B60L 58/26* (2019.01)
*B60K 6/22* (2007.10)

(52) U.S. Cl.
CPC ........ *H01L 35/32* (2013.01); *H01M 10/6554* (2015.04); *H01M 10/6556* (2015.04); *H01M 10/6567* (2015.04); *B60K 6/22* (2013.01); *B60L 58/26* (2019.02); *B60Y 2200/91* (2013.01); *B60Y 2200/92* (2013.01); *B60Y 2306/05* (2013.01); *H01M 2220/20* (2013.01)

(58) Field of Classification Search
CPC .......... F25B 21/04; H01L 35/30; H01L 35/32; B60L 58/26; B60K 6/22; B60Y 2200/91; B60Y 2200/92; B60Y 2306/05
USPC ............................................................. 62/3.3
See application file for complete search history.

(56) References Cited

U.S. PATENT DOCUMENTS

| | | | | |
|---|---|---|---|---|
| 5,564,276 A * | 10/1996 | Abadilla | ................ | F25B 21/04 62/3.5 |
| 6,226,994 B1 * | 5/2001 | Yamada | ................ | H01L 35/32 136/203 |
| 6,307,142 B1 * | 10/2001 | Allen | ................ | H01L 35/30 136/205 |
| 6,345,507 B1 * | 2/2002 | Gillen | ................ | H01L 35/30 136/203 |
| 6,446,442 B1 * | 9/2002 | Batchelor | ................ | F25B 21/02 62/3.2 |
| 6,619,044 B2 * | 9/2003 | Batchelor | ................ | F28F 1/045 62/3.2 |
| 7,338,117 B2 * | 3/2008 | Iqbal | ................ | A47C 7/72 297/180.12 |
| 7,571,759 B2 * | 8/2009 | Inagaki | ................ | F28D 1/0325 165/80.4 |
| 7,849,697 B2 * | 12/2010 | Sung | ................ | F24F 5/0042 62/3.3 |
| 8,302,408 B2 * | 11/2012 | Miki | ................ | F28F 3/083 62/3.3 |
| 8,359,871 B2 * | 1/2013 | Woods | ................ | H01L 35/30 62/3.2 |
| 8,547,697 B2 * | 10/2013 | Fukutani | ................ | H01L 25/072 361/689 |
| 8,755,185 B2 * | 6/2014 | Chou | ................ | H01L 24/33 165/80.4 |
| 10,422,592 B2 * | 9/2019 | Deguchi | ................ | F28F 13/12 |
| 10,500,994 B1 * | 12/2019 | Dry | ................ | B60N 2/5692 |
| 2002/0152757 A1 * | 10/2002 | Chen | ................ | H01L 35/30 136/204 |
| 2002/0184894 A1 * | 12/2002 | Batchelor | ................ | F28F 3/12 62/3.3 |
| 2004/0068991 A1 * | 4/2004 | Banney | ................ | F28F 1/045 62/3.3 |
| 2007/0037051 A1 * | 2/2007 | Kim | ................ | H01M 50/20 429/151 |
| 2007/0178377 A1 * | 8/2007 | Kim | ................ | H01M 10/613 429/130 |
| 2008/0063929 A1 * | 3/2008 | Byun | ................ | H01M 50/502 429/121 |
| 2020/0373638 A1 * | 11/2020 | Lee | ................ | H01M 10/66 |
| 2022/0015259 A1 * | 1/2022 | Agarwal | ................ | H05K 7/2029 |

* cited by examiner

HEAT EXCHANGER WITH THERMOELECTRIC MODULE AND SYSTEM FOR MANAGING HEAT OF BATTERY INCLUDING SAME

CROSS REFERENCE TO RELATED APPLICATION

The present application claims priority to Korean Patent Application No. 10-2019-0060009, filed May 22, 2019, the entire contents of which is incorporated herein for all purposes by this reference.

BACKGROUND

Field of the Disclosure

The present disclosure relates a heat exchanger with a thermoelectric module and a system for managing heat of a battery including the same.

Description of the Related Art

The popularization of electric vehicles or hybrid vehicles has increased the importance of batteries. Such an interest has extended not only to capacity of the batteries, but also to factors affecting efficiency or life span of the batteries.

A high-voltage, high-capacity battery used in an electric vehicle or a hybrid vehicle is generally constituted by a battery pack in which multiple battery cells are packed into one pack, and a plurality of such battery packs are provided to constitute an entire battery.

Due to the fact that the battery packs are mounted together in a limited space, high heat is generated in the battery packs, which adversely affects the entire life span of the battery. Therefore, constructing a cooling system for controlling high heat of a high-voltage and high-capacity battery used in an electric vehicle or a hybrid vehicle is essential. In general, a high-voltage and high-capacity battery cooling method for a vehicle is divided into air cooling and water cooling, and each method is subdivided into an indirect cooling and a direct cooling method.

Meanwhile, in the case of a water cooling system used for battery thermal management in the related art, management of the water cooling system is performed in cooperation with an air conditioning system of a vehicle. This requires complex control of the water cooling system and also complex connection between components of the water cooling system and air conditioning system. Accordingly, there is a need to develop a technology for enabling battery thermal management in a simpler manner independent of the air conditioning system of the vehicle.

The foregoing is intended merely to aid in the understanding of the background of the present disclosure, and is not intended to mean that the present disclosure falls within the purview of the related art that is already known to those skilled in the art.

SUMMARY OF THE DISCLOSURE

Accordingly, the present disclosure has been made keeping in mind the above problem occurring in the related art, and an objective of the present disclosure is to provide a heat exchanger with a thermoelectric module and a system for managing heat of a battery including the same, whereby through application of the heat exchanger with the thermoelectric module, thermal management of the battery is realized only by controlling the heat exchanger with the thermoelectric module.

In order to achieve the above objective, according to one aspect of the present disclosure, there is provided a heat exchanger with a thermoelectric module, the heat exchanger including: a first heat exchanger including a first heat sink provided with a first base plate and first heat dissipation pins, a first thermoelectric module located over the first heat sink and performing heat absorption and heat dissipation, a plate-shaped first cooling plate located over the first thermoelectric module and having a flow channel through which coolant flows, and a first cover covering top of the first cooling plate; and a second heat exchanger having the same structure as the first heat exchanger and located under the first heat exchanger to be symmetrical with the first heat exchanger.

The second heat exchanger may include: a second heat sink provided with a second base plate and second heat dissipation pins and configured such that the second heat dissipation pins are disposed to face the first heat dissipation pins; a second thermoelectric module located under the second heat sink and performing heat absorption and heat dissipation; a plate-shaped second cooling plate located under the second thermoelectric module and having a flow channel through which the coolant flows; and a second cover covering bottom of the second cooling plate.

The first cover and the second cover may be respectively in contact with an upper surface of the first cooling plate and a lower surface of the second cooling plate to define respective closed end surfaces, thereby defining respective cooling channels.

The heat exchanger may further include: a first thermal interface material located between the first cooling plate and the first thermoelectric module; and a second thermal interface material located between the first thermoelectric module and the first heat sink.

The heat exchanger may further include: a third thermal interface material located between the second heat sink and the second thermoelectric module; and a fourth thermal interface material located between the second thermoelectric module and the second cooling plate.

The first cooling plate may include a first inlet into which the coolant is introduced, and a first outlet from which the coolant is withdrawn after being circulated through the flow channel of the first cooling plate, and the second cooling plate may include a second inlet into which the coolant withdrawn from the first outlet is introduced, and a second outlet from which the coolant is withdrawn after being circulated through the flow channel of the second cooling plate.

The heat exchanger may further include a connection pipe connecting the first outlet and the second inlet to each other.

The heat exchanger may further include: a cooling fan supplying cooling air to the first heat dissipation pins and the second heat dissipation pins; a cooling fan cover covering the cooling fan; and a first cooling air guide part and a second cooling air guide part respectively coupled to an upper portion and a lower portion of the cooling fan, and guiding flow of the cooling air such that the cooling air introduced through the cooling fan is distributed to the first heat dissipation pins and the second dissipation pins.

Each of the first thermoelectric module and the second thermoelectric module may be configured such that multiple thermoelectric elements are connected to each other.

The number of the thermoelectric elements constituting each of the first thermoelectric module and the second thermoelectric module may be determined on the basis of a predetermined cooling performance of each of the first heat exchanger and the second heat exchanger.

A shape of each of the flow channels formed in the first cooling plate and the second cooling plate may be determined on the basis of a predetermined cooling performance of each of the first heat exchanger and the second heat exchanger.

According to another aspect of the present disclosure, there is provided a system for managing heat of a battery including a heat exchanger with a thermoelectric module, the system including: a battery thermal management device including a coolant flow channel through which coolant flows for cooling down or heating up a battery module, a coolant inlet portion into which the coolant is introduced, and a coolant outlet portion from which the coolant is withdrawn after being circulated through the coolant flow channel; and the heat exchanger with the thermoelectric module, the heat exchanger being configured such that the coolant withdrawn from the coolant outlet portion of the battery thermal management device is introduced into the heat exchanger, and the introduced coolant undergoes cooling down or heating up and is then introduced into the coolant inlet portion of the battery thermal management device, whereby the battery module is cooled down or heated up.

The heat exchanger with the thermoelectric module may include: a first heat exchanger including a first heat sink provided with a first base plate and first heat dissipation pins, a first thermoelectric module located over the first heat sink and performing heat absorption and heat dissipation, a plate-shaped first cooling plate located over the first thermoelectric module and having a flow channel through which coolant flows, and a first cover covering top of the first cooling plate; and a second heat exchanger having the same structure as the first heat exchanger and located under the first heat exchanger to be symmetrical with the first heat exchanger.

The second heat exchanger may include: a second heat sink provided with a second base plate and second heat dissipation pins and configured such that the second heat dissipation pins are disposed to face the first heat dissipation pins; a second thermoelectric module located under the second heat sink and performing heat absorption and heat dissipation; a plate-shaped second cooling plate located under the second thermoelectric module and having a flow channel through which the coolant flows; and a second cover covering bottom of the second cooling plate.

The first cooling plate may include a first inlet into which the coolant withdrawn from the coolant outlet portion of the battery thermal management device is introduced, and a first outlet from which the coolant is withdrawn after being circulated through the flow channel of the first cooling plate, and the second cooling plate may include a second inlet into which the coolant withdrawn from the first outlet is introduced, and a second outlet from which the coolant is withdrawn after being circulated through the flow channel of the second cooling plate.

The system may further include a connection pipe connecting the first outlet and the second inlet to each other.

The system may further include: a coolant storage part storing the coolant withdrawn from the second outlet; and a pump connected to the coolant storage part and to the coolant inlet portion of the battery thermal management device to introduce the coolant stored in the coolant storage part into the coolant inlet portion.

According to the system for managing heat of the battery including the heat exchanger with the thermoelectric module according to the embodiment of the present disclosure, the coolant withdrawn from the battery thermal management device is introduced into the heat exchanger with the thermoelectric module, and the introduced coolant undergoes cooling down or heating up in the heat exchanger with the thermoelectric module and is then again introduced into the battery thermal management device, whereby it is possible to more efficiently cool down or heat up the battery module of the battery thermal management device.

In addition, cooling down or heating up the battery module of the battery thermal management device is realized by controlling only the heat exchanger with the thermoelectric module. This makes it possible to perform thermal management of the battery module more simply than the related art which requires complex control due to the fact that a battery thermal management device and a vehicle air conditioning system operate in cooperation with each other.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Figure 1:
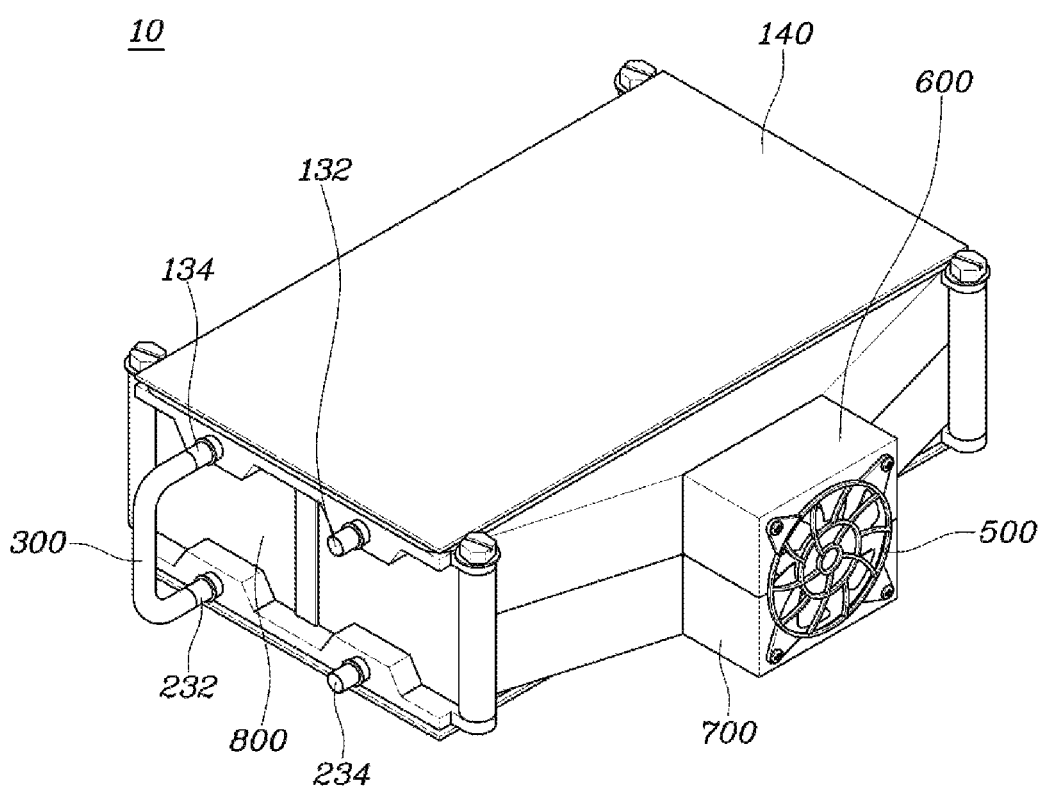
FIG. 1 is a view showing a heat exchanger having with a thermoelectric module according to an embodiment of the present disclosure.

Hereinbelow, a heat exchanger with a thermoelectric module according to an embodiment of the present disclosure and a system for managing heat of a battery including the same will be described in detail with reference to the accompanying drawings. Throughout the drawings, the same reference numerals will refer to the same or like parts.

Figure 2:
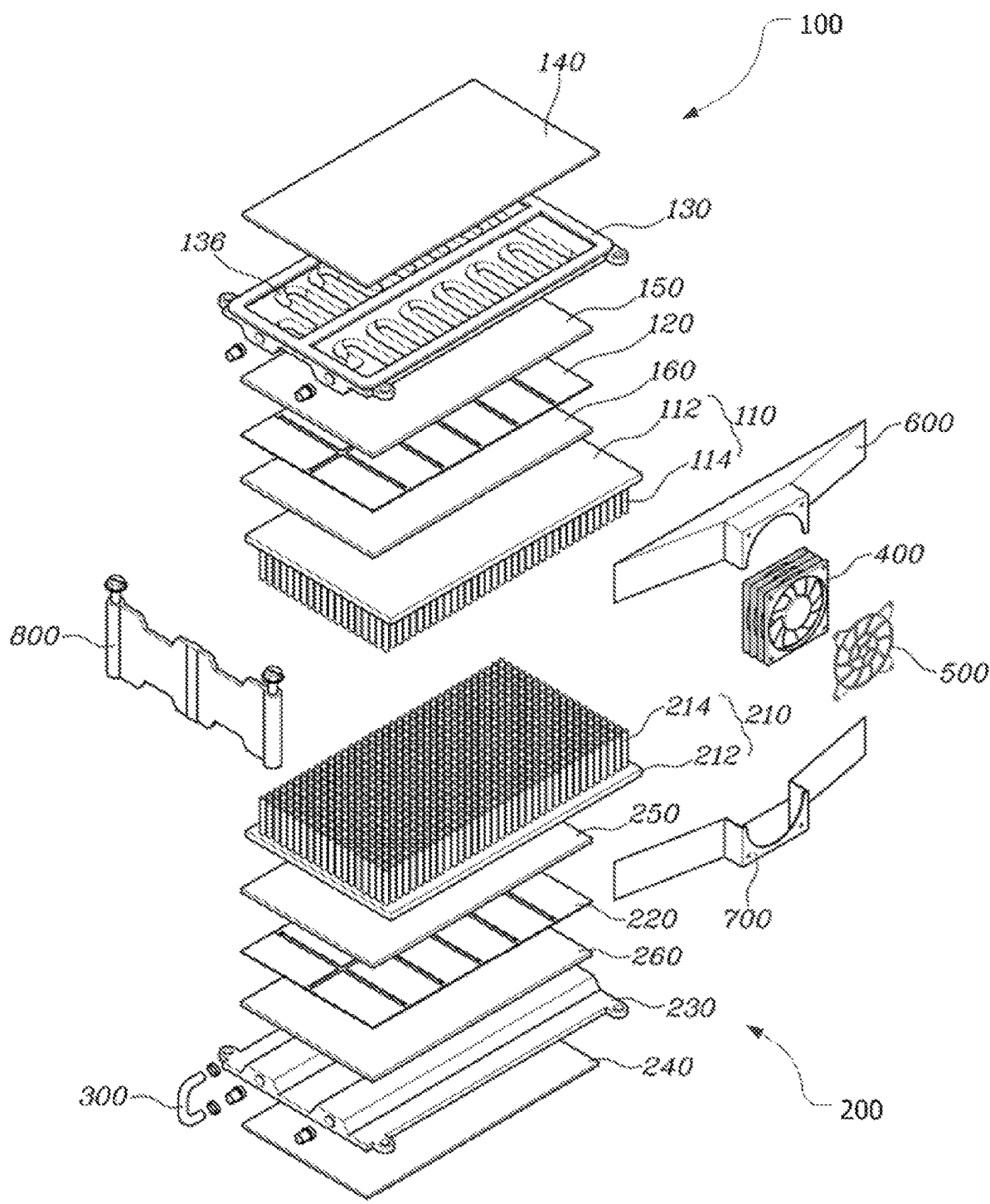
FIG. 2 is an exploded perspective view showing the heat exchanger having with the thermoelectric module according to the embodiment of the present disclosure.
Figure 3:
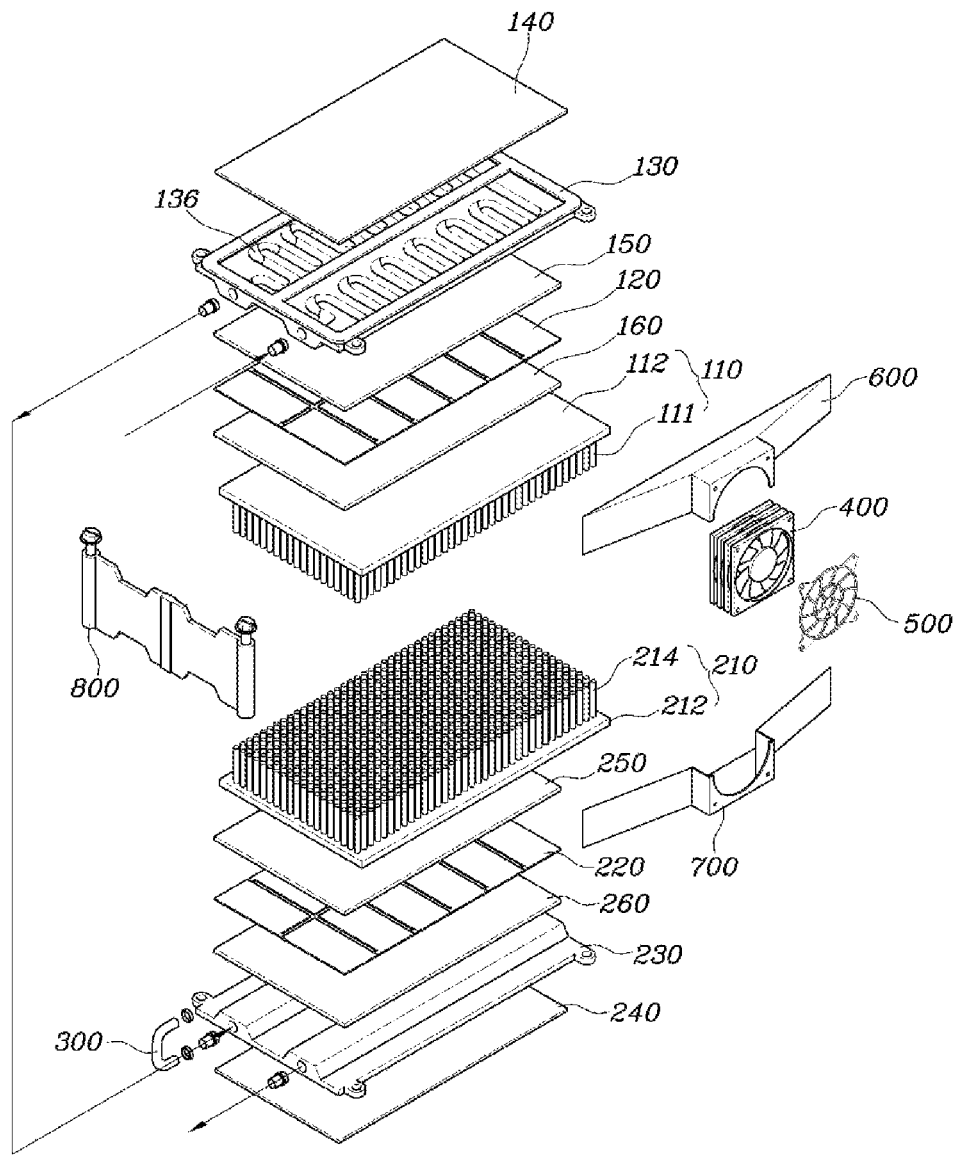
FIG. 3 is a view showing flow of coolant in the heat exchanger with the thermoelectric module according to the embodiment of the present disclosure.
Figure 4:
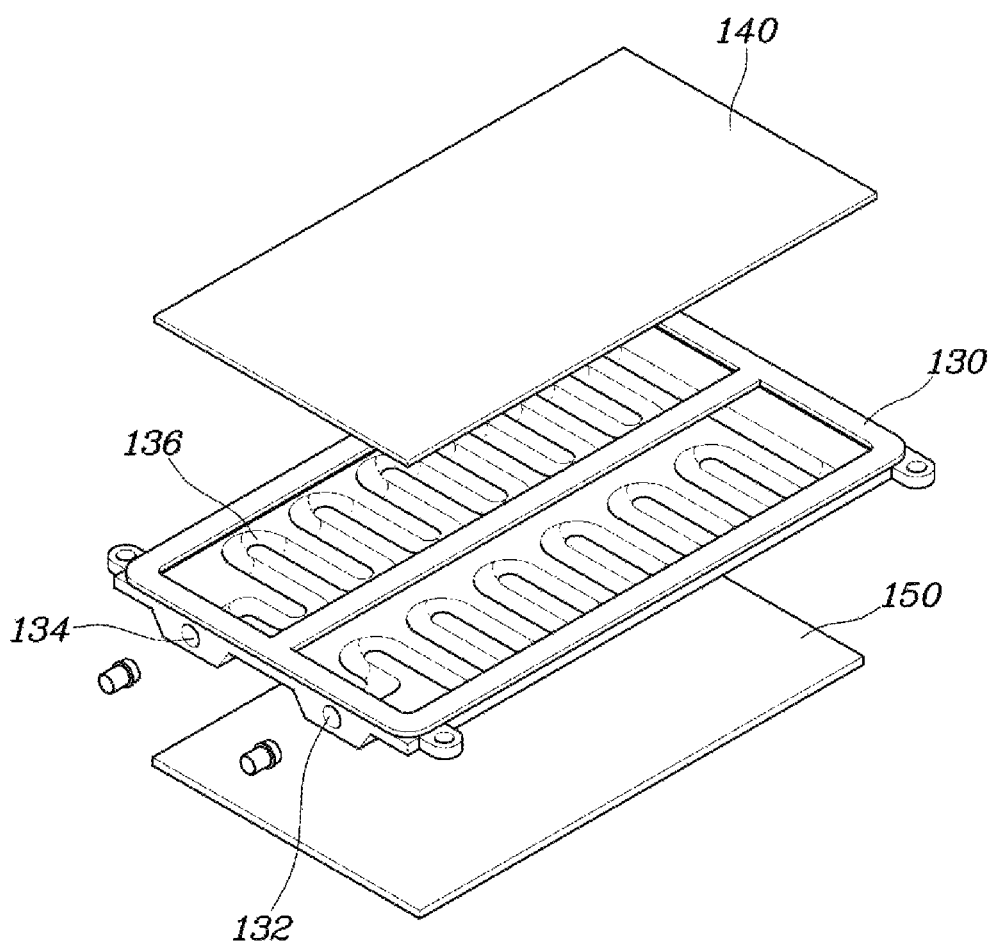
FIG. 4 is a view showing a shape of a flow channel formed in a first cooling plate in the heat exchanger with the thermoelectric module according to the embodiment of the present disclosure.
Figure 5:
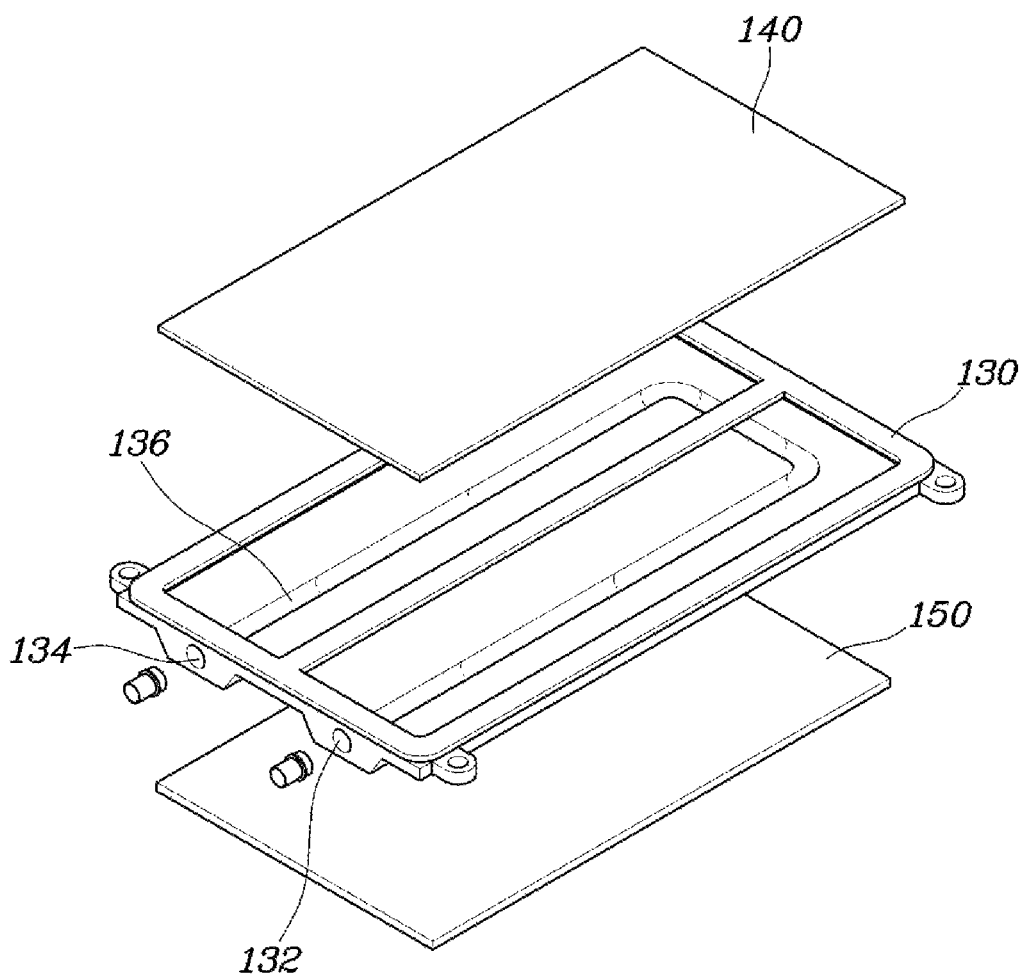
FIG. 5 is a view showing a shape of a flow channel formed in a first cooling plate in a heat exchanger with a thermoelectric module according to another embodiment of the present disclosure.
Figure 6:
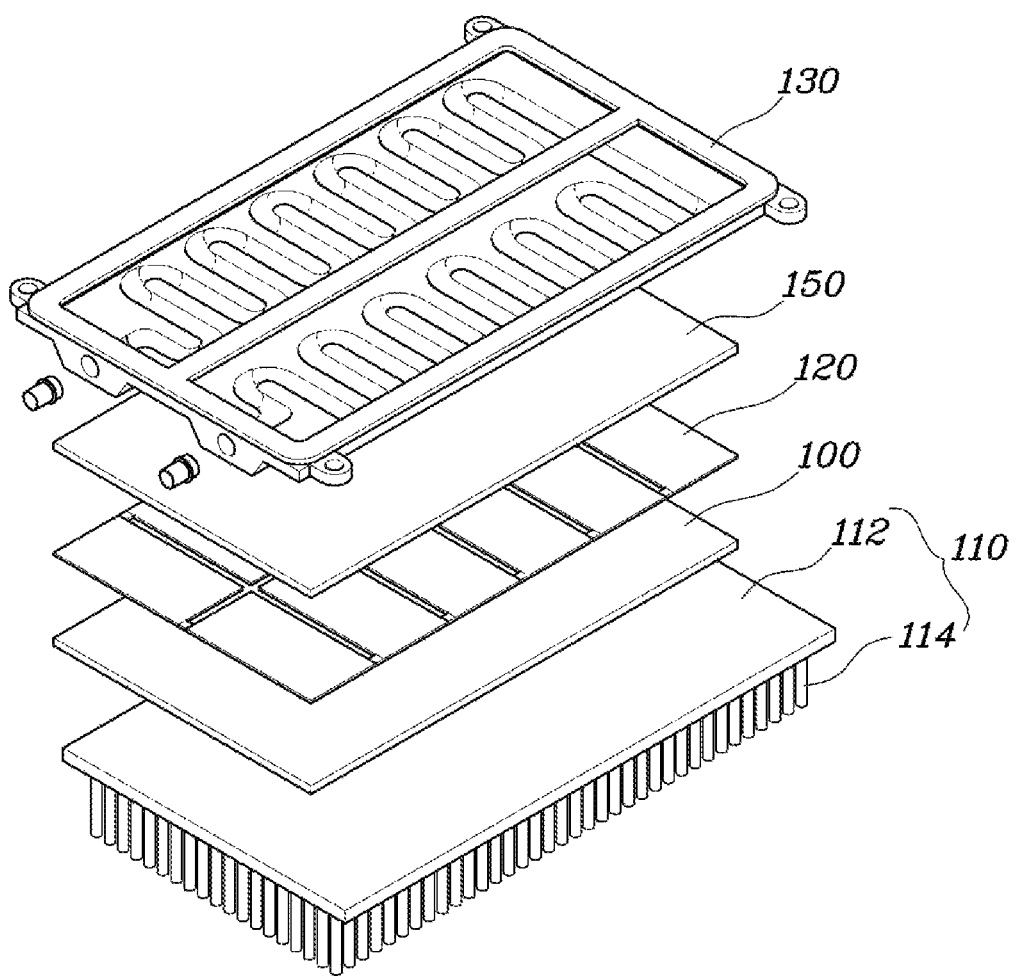
FIG. 6 is a view showing a first thermoelectric module including multiple thermoelectric elements in the heat exchanger with the thermoelectric module according to the embodiment of the present disclosure.
Figure 7:
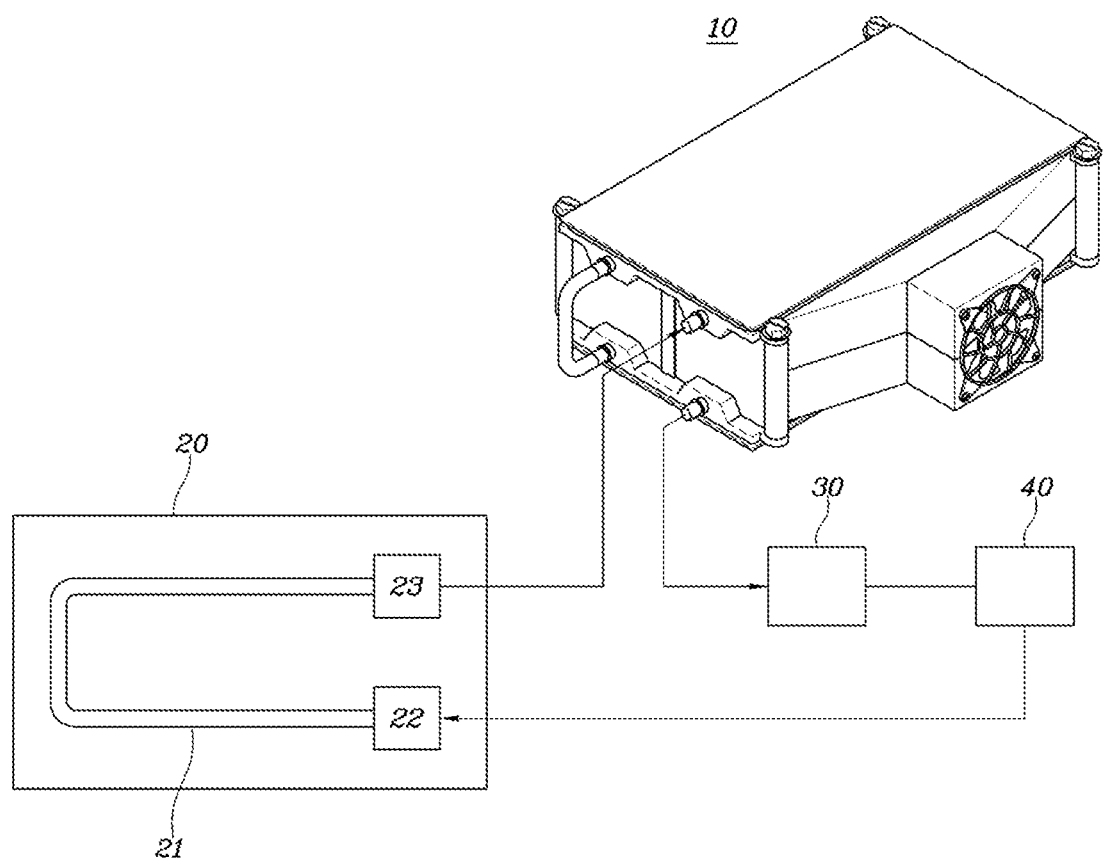
FIG. 7 is a system for managing heat of a battery including a heat exchanger with a thermoelectric module according to an embodiment of the present disclosure.

FIG. 1 is a view showing a heat exchanger having with a thermoelectric module according to an embodiment of the present disclosure, FIG. 2 is an exploded perspective view showing the heat exchanger having with the thermoelectric module according to the embodiment of the present disclosure, FIG. 3 is a view showing flow of coolant in the heat exchanger with the thermoelectric module according to the embodiment of the present disclosure, FIG. 4 is a view showing a shape of a flow channel formed in a first cooling plate in the heat exchanger with the thermoelectric module according to the embodiment of the present disclosure, FIG. 5 is a view showing a shape of a flow channel formed in a first cooling plate in a heat exchanger with a thermoelectric module according to another embodiment of the present disclosure, FIG. 6 is a view showing a first thermoelectric module including multiple thermoelectric elements in the heat exchanger with the thermoelectric module according to the embodiment of the present disclosure, and FIG. 7 is a system for managing heat of a battery including a heat exchanger with a thermoelectric module according to an embodiment of the present disclosure.

Referring to FIGS. 1 and 2, the heat exchanger 10 with the thermoelectric module according to the embodiment of the present disclosure includes a first heat exchanger 100, and a second heat exchanger 200 having the same structure as the first heat exchanger 100 and located under the first heat exchanger 100 to be symmetrical with the first heat exchanger 100.

In detail, the first heat exchanger 100 includes a first heat sink 110 provided with a first base plate 112 and first heat dissipation pins 114, a first thermoelectric module 120 located over the first heat sink 110 and performing heat absorption and heat dissipation, a plate-shaped first cooling plate 130 located over the first thermoelectric module 120 and having a flow channel through which coolant flows, and a first cover 140 covering top of the first cooling plate 130. Here, the first cover 140 is in contact with an upper surface of the first cooling plate 130 to define a closed end surface, thereby defining a cooling channel.

In addition, the first heat dissipation pins 114 dissipate heat which is generated from the first thermoelectric module 120 into the atmosphere when the coolant flowing through the first cooling plate 130 is cooled down by the first thermoelectric module 120, or the first heat dissipation pins 114 transfer heat in the atmosphere to the first thermoelectric module 120 when the coolant flowing through the first cooling plate 130 is heated up by the first thermoelectric module 120.

Furthermore, the first heat exchanger 100 may further include a first thermal interface material 150 located between the first cooling plate 130 and the first thermoelectric module 120, and a second thermal interface material 160 located between the first thermoelectric module 120 and the first heat sink 110. Here, the first thermal interface material 150 and the second thermal interface material 160 serve to prevent air bubbles from being trapped on a contact surface between the first cooling plate 130 and the first thermoelectric module 120 and a contact surface between the first thermoelectric module 120 and the first heat sink 110, while facilitating heat transfer between the first heat sink 110, the first thermoelectric module 120, and the first cooling plate 130.

In addition, the second heat exchanger 200 includes a second heat sink 210 provided with a second base plate 212 and second heat dissipation pins 214 and configured such that the second heat dissipation pins 214 are disposed to face the first heat dissipation pins 114 as shown in FIG. 2. A second thermoelectric module 220 located under the second heat sink 210 performs heat absorption and heat dissipation. A plate-shaped second cooling plate 230 is located under the second thermoelectric module 220 and has a flow channel through which the coolant flows, and a second cover 240 covers the bottom of the second cooling plate 230. Here, the second cover 240 is in contact with a lower surface of the second cooling plate 230 to define a closed end surface, thereby defining a cooling channel.

In addition, the second heat dissipation pins 214 dissipate heat which is generated from the second thermoelectric module 220 into the atmosphere when the coolant flowing through the second cooling plate 230 is cooled down by the second thermoelectric module 220, or the second heat dissipation pins 214 transfer heat in the atmosphere to the second thermoelectric module 220 when the coolant flowing through the second cooling plate 230 is heated up by the second thermoelectric module 220.

At this time, the shape of each of the flow channels formed in the first cooling plate 130 and the second cooling plate 230 is determined on the basis of a predetermined cooling performance of each of the first heat exchanger 100 and the second heat exchanger 200. In an embodiment, when the predetermined cooling performance of the first heat exchanger 100 is high, a flow channel 136 having a shape as shown in FIG. 4 is formed to thereby increase contact time of the coolant flowing through the flow channel with the first thermoelectric module 120. On the contrary, when the predetermined cooling performance of the first heat exchanger 100 is low, a flow channel 136 having a shape as shown in FIG. 5 is formed to thereby decrease contact time of the coolant flowing through the flow channel with the first thermoelectric module 120.

The second heat exchanger 200 may further include a third thermal interface material 250 located between the second heat sink 210 and the second thermoelectric module 220, and a fourth thermal interface material 260 located between the second thermoelectric module 220 and the second cooling plate 230. Here, the third thermal interface material 250 and the fourth thermal interface material 260 serve to prevent air bubbles from being trapped on a contact surface between the second cooling plate 230 and the second thermoelectric module 220 and a contact surface between the second thermoelectric module 220 and the second heat sink 210, while facilitating heat transfer between the second heat sink 210, the second thermoelectric module 220, and the second cooling plate 230.

Meanwhile, in the present disclosure, it is preferable that the first heat sink 110 and the second heat sink 210 are made of a material having excellent thermal conductivity. In an embodiment, the first heat sink 110 and the second heat sink 210 are made of aluminum or copper.

Meanwhile, in the present disclosure, each of the first thermoelectric module 120 and the second thermoelectric module 220 is configured such that multiple thermoelectric elements are connected to each other as shown in FIG. 6. At this time, the number of thermoelectric elements constituting the first thermoelectric module 120 and the second thermoelectric module 220 is determined on the basis of the predetermined cooling performance of each of the first heat exchanger and the second heat exchanger. In an embodiment, when the cooling performances of the heat exchangers are relatively low, fewer thermoelectric elements constituting the thermoelectric modules are provided. In another embodiment, when the cooling performances of the heat exchangers are relatively high, more thermoelectric elements constituting the thermoelectric modules are provided.

In detail, in the present disclosure, the thermoelectric elements perform heat absorption and heat dissipation through opposite electrical polarities as is well known in the art. That is, the thermoelectric elements perform heat absorption and heat dissipation by polarity switching, thus cooling down or heating up an object. The first thermoelectric module 120 and the second thermoelectric module 220 each of which constituted by the multiple thermoelectric elements having the above-described characteristics perform heat absorption or heat dissipation on the basis of control of polarity switching, thus cooling down or heating up the coolant flowing through the flow channels of the first cooling plate 130 and the second cooling plate 230.

Meanwhile, the first cooling plate 130 of the first heat exchanger 100 has a first inlet 132 into which the coolant is introduced, and a first outlet 134 from which the coolant is withdrawn after being circulated through the flow channel of the first cooling plate 130. Furthermore, the second cooling plate 230 of the second heat exchanger 200 has a second inlet 232 into which the coolant withdrawn from the first outlet 134 is introduced, and a second outlet 234 from which the coolant is withdrawn after being circulated through the flow channel of the second cooling plate 230. In addition, the heat exchanger 10 with the thermoelectric module according to the embodiment of the present disclosure may further include a connection pipe 300 connecting the first outlet 134 and the second inlet 232 to each other.

As such, in the heat exchanger 10 with the thermoelectric module according to the embodiment of the present disclosure, as shown in FIG. 3, the coolant introduced into the first inlet 132 of the first cooling plate 130 is circulated through the flow channel 136 and is introduced into the second inlet 232 of the second cooling plate 230 through the first outlet 134 and the connection pipe 300, and then, the coolant circulated through the flow channel 236 of the second cooling plate 230 is withdrawn from the second outlet 234, whereby the coolant circulated in the first cooling plate 130 and the second cooling plate 230 is cooled down or heated up by the first thermoelectric module 120 and the second thermoelectric module 220.

Meanwhile, the heat exchanger 10 with the thermoelectric module according to the present disclosure may further include a cooling fan 400, a cooling fan cover 500, a first cooling air guide part 600, a second cooling air guide part 700, and a heat dissipation pin cover 800.

In detail, the cooling fan 400 supplies cooling air to the first heat dissipation pins 114 and the second heat dissipation pins 214. Furthermore, the cooling fan cover 500 prevents external foreign substances from flowing into the cooling fan 400.

The first cooling air guide part 600 is coupled to an upper portion of the cooling fan 400, and the second cooling air guide part 700 is coupled to a lower portion of the cooling fan 400. At this time, the first cooling air guide part 600 and the second cooling air guide part 700 guide flow of the cooling air such that the cooling air introduced through the cooling fan 400 is distributed to the first heat dissipation pins 114 and the second dissipation pins 214. This makes it possible to increase air volume of the cooling fan 400 supplied to the first heat dissipation pins 114 and the second heat dissipation fins 214, thereby improving the overall cooling performance of the heat exchangers.

Meanwhile, it is required to prevent the cooling air supplied through the cooling fan 400 to the first heat dissipation pins 114 and the second heat dissipation pins 214 from flowing out of the heat exchangers. In the present disclosure, preventing the cooling air from flowing out of the heat exchangers is achieved by the first cooling air guide part 600, the second cooling air guide part 700, and the heat dissipation pin cover 800.

FIG. 7 is a system for managing heat of a battery including a heat exchanger with a thermoelectric module according to an embodiment of the present disclosure. Referring to FIG. 7, the system for managing heat of the battery including the heat exchanger with the thermoelectric module according to the embodiment of the present disclosure includes: a battery thermal management device 20 including a coolant flow channel 21 through which coolant flows for cooling down or heating up a battery module, a coolant inlet portion 22 into which the coolant is introduced, and a coolant outlet portion 23 from which the coolant is withdrawn after being circulated through the coolant flow channel 21; and a heat exchanger 10 with a thermoelectric module, the heat exchanger being configured such that the coolant withdrawn from the coolant outlet portion 23 of the battery thermal management device 20 is introduced into the heat exchanger, and the introduced coolant undergoes cooling down or heating up and is then introduced into the coolant inlet portion 22 of the battery thermal management device 20, whereby the battery module is cooled down or heated up.

At this time, the heat exchanger 10 with the thermoelectric module includes a first heat exchanger 100, and a second heat exchanger 200 having the same structure and shape as the first heat exchanger 100 and located under the first heat exchanger 100 to be symmetrical with the first heat exchanger 100.

In detail, the first heat exchanger 100 includes a first heat sink 110 provided with a first base plate 112 and first heat dissipation pins 114, a first thermoelectric module 120 located over the first heat sink 110 and performing heat absorption and heat dissipation, a plate-shaped first cooling plate 130 located over the first thermoelectric module 120 and having a flow channel through which coolant flows, and a first cover 140 covering top of the first cooling plate 130.

In addition, the second heat exchanger 200 includes a second heat sink 210 provided with a second base plate 212 and second heat dissipation pins 214 and configured such that the second heat dissipation pins 214 are disposed to face the first heat dissipation pins 114 as shown in FIG. 2, a second thermoelectric module 220 located under the second heat sink 210 and performing heat absorption and heat dissipation, a plate-shaped second cooling plate 230 located under the second thermoelectric module 220 and having a flow channel through which the coolant flows, and a second cover 240 covering the bottom of the second cooling plate 230.

Furthermore, the first cooling plate 130 of the first heat exchanger 100 has a first inlet 132 into which the coolant is introduced, and a first outlet 134 from which the coolant is withdrawn after being circulated through the flow channel of the first cooling plate 130. Furthermore, the second cooling plate 230 of the second heat exchanger 200 has a second inlet 232 into which the coolant withdrawn from the first outlet 134 is introduced, and a second outlet 234 from which the coolant is withdrawn after being circulated through the flow channel of the second cooling plate 230. In addition, the heat exchanger 10 with the thermoelectric module according to the embodiment of the present disclosure may further include a connection pipe 300 connecting the first outlet 134 and the second inlet 232 to each other.

Meanwhile, the system for managing heat of the battery including the heat exchanger with the thermoelectric module according to the embodiment of the present disclosure may further include a coolant storage part 30 for storing the coolant withdrawn from the second outlet 234 of the heat exchanger 10 with thermoelectric module, and a pump 40 connected to the coolant storage part 30 and to the coolant inlet portion 22 of the battery thermal management device 20 to introduce the coolant stored in the coolant storage part 30 into the coolant inlet portion 22. In an embodiment, the pump 40 may be an electric water pump (EWP) or the like.

As described above, according to the system for managing heat of the battery including the heat exchanger with the thermoelectric module according to the embodiment of the present disclosure, the coolant withdrawn from the battery thermal management device is introduced into the heat exchanger with the thermoelectric module, and the introduced coolant undergoes cooling down or heating up in the heat exchanger with the thermoelectric module and is then again introduced into the battery thermal management device, whereby it is possible to more efficiently cool down or heat up the battery module of the battery thermal management device.

In addition, cooling down or heating up the battery module of the battery thermal management device is realized by controlling only the heat exchanger with the thermoelectric module. This makes it possible to perform thermal management of the battery module more simply than the related art which requires complex control due to the fact that a battery thermal management device and a vehicle air conditioning system operate in cooperation with each other.

Although exemplary embodiments of the present disclosure have been described for illustrative purposes, those skilled in the art will appreciate that various modifications, additions and substitutions are possible, without departing from the scope and spirit of the disclosure as disclosed in the accompanying claims.

The invention claimed is:

1. A heat exchanger with a thermoelectric module, the heat exchanger comprising:
   a first heat exchanger including a first heat sink provided with a first base plate and first heat dissipation pins, a first thermoelectric module located over the first heat sink and performing heat absorption and heat dissipation, a plate-shaped first cooling plate located over the first thermoelectric module and having a flow channel through which coolant flows, and a first cover covering top of the first cooling plate; and
   a second heat exchanger having the same structure as the first heat exchanger and located under the first heat exchanger to be symmetrical with the first heat exchanger;
   wherein the second heat exchanger includes:
      a second heat sink provided with a second base plate and second heat dissipation pins and configured such that the second heat dissipation pins are disposed to face the first heat dissipation pins;
      a second thermoelectric module located under the second heat sink and performing heat absorption and heat dissipation;
      a plate-shaped second cooling plate located under the second thermoelectric module and having a flow channel through which the coolant flows; and
      a second cover covering bottom of the second cooling plate; and
   wherein the first cooling plate includes a first inlet into which the coolant is introduced, and a first outlet from which the coolant is withdrawn after being circulated through the flow channel of the first cooling plate; and
   the second cooling plate includes a second inlet into which the coolant withdrawn from the first outlet is introduced, and a second outlet from which the coolant is withdrawn after being circulated through the flow channel of the second cooling plate.

2. The heat exchanger of claim 1, wherein the first cover and the second cover are respectively in contact with an upper surface of the first cooling plate and a lower surface of the second cooling plate to define respective closed end surfaces, thereby defining respective cooling channels.

3. The heat exchanger of claim 1, further comprising:
   a first thermal interface material located between the first cooling plate and the first thermoelectric module; and
   a second thermal interface material located between the first thermoelectric module and the first heat sink.

4. The heat exchanger of claim 1, further comprising:
   a third thermal interface material located between the second heat sink and the second thermoelectric module; and
   a fourth thermal interface material located between the second thermoelectric module and the second cooling plate.

5. The heat exchanger of claim 1, further comprising:
   a connection pipe connecting the first outlet and the second inlet to each other.

6. The heat exchanger of claim 1, further comprising:
   a cooling fan supplying cooling air to the first heat dissipation pins and the second heat dissipation pins;
   a cooling fan cover covering the cooling fan; and
   a first cooling air guide part and a second cooling air guide part respectively coupled to an upper portion and a lower portion of the cooling fan, and guiding flow of the cooling air such that the cooling air introduced through the cooling fan is distributed to the first heat dissipation pins and the second dissipation pins.

7. The heat exchanger of claim 1, wherein each of the first thermoelectric module and the second thermoelectric module is configured such that multiple thermoelectric elements are connected to each other.

8. The heat exchanger of claim 7, wherein number of the thermoelectric elements constituting each of the first thermoelectric module and the second thermoelectric module is determined on the basis of a predetermined cooling performance of each of the first heat exchanger and the second heat exchanger.

9. The heat exchanger of claim 1, wherein a shape of each of the flow channels formed in the first cooling plate and the second cooling plate is determined on the basis of a predetermined cooling performance of each of the first heat exchanger and the second heat exchanger.

* * * * *